(12) United States Patent
Chen et al.

(10) Patent No.: US 11,597,257 B2
(45) Date of Patent: Mar. 7, 2023

(54) TRANSPORTATION REFRIGERATION SYSTEM, FOR TRANSPORTATION VEHICLE, CONTROL METHOD THEREOF AND ELECTRIC TRANSPORTATION VEHICLE

(71) Applicant: Carrier Corporation, Palm Beach Gardens, FL (US)

(72) Inventors: Linhui Chen, Shanghai (CN); Yiming Wen, Shanghai (CN); Pu Zheng, Shanghai (CN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 15/734,152

(22) PCT Filed: May 22, 2020

(86) PCT No.: PCT/US2020/034188
§ 371 (c)(1),
(2) Date: Dec. 1, 2020

(87) PCT Pub. No.: WO2020/242930
PCT Pub. Date: Dec. 3, 2020

(65) Prior Publication Data
US 2022/0072931 A1 Mar. 10, 2022

(30) Foreign Application Priority Data
May 28, 2019 (CN) .......................... 201910451000.6

(51) Int. Cl.
*B60H 1/32* (2006.01)
*G01R 31/382* (2019.01)

(52) U.S. Cl.
CPC ......... *B60H 1/3205* (2013.01); *B60H 1/3232* (2013.01); *G01R 31/382* (2019.01);
(Continued)

(58) Field of Classification Search
CPC ................ B60H 1/3232; B60H 1/3205; B60H 2001/3272; B60H 2001/3277
See application file for complete search history.

(56) References Cited

U.S. PATENT DOCUMENTS

| 5,557,941 A | 9/1996 | Hanson et al. |
| 6,052,998 A * | 4/2000 | Dage ................. B60H 1/00821 62/282 |

(Continued)

FOREIGN PATENT DOCUMENTS

| CN | 104006471 A | 8/2014 |
| JP | 5478909 B2 | 4/2014 |
| WO | 2019031419 A1 | 2/2019 |

OTHER PUBLICATIONS

International Search Report and Written Opinion for International Application No. PCT/US2020/034188; International Filing Date May 22, 2020; dated Aug. 26, 2020 (pp. 1-33).

*Primary Examiner* — Nelson J Nieves
(74) *Attorney, Agent, or Firm* — Cantor Colburn LLP

(57) ABSTRACT

A transport refrigeration system, a control method therefor and an electric transport vehicle are provided by the present disclosure. The control method for the transport refrigeration system includes: if a ratio of a current battery charge amount to a minimum battery charge amount is not less than a first preset value, controlling power consuming units in the transport refrigeration system to operate in a power-unrestricted state; and if the ratio of the current battery charge amount to the minimum battery charge amount is less than the first preset value, controlling the power consuming units in the transport refrigeration system to operate in a power-restricted state; wherein the power-restricted state is associated with the ratio of the current battery charge amount to the minimum battery charge amount.

10 Claims, 1 Drawing Sheet

(52) U.S. Cl.
CPC ............... *B60H 2001/3272* (2013.01); *B60H 2001/3277* (2013.01); *B60H 2001/3282* (2013.01)

(56) References Cited

U.S. PATENT DOCUMENTS

| | | | |
|---|---|---|---|
| 7,259,469 B2* | 8/2007 | Brummett | B60H 1/3226 |
| | | | 290/40 C |
| 8,295,950 B1 | 10/2012 | Wordsworth et al. | |
| 8,825,242 B2 | 9/2014 | Foster | |
| 9,557,100 B2 | 1/2017 | Chopko et al. | |
| 9,960,609 B2 | 5/2018 | Muralidhar et al. | |
| 2005/0141154 A1* | 6/2005 | Consadori | B60H 1/00364 |
| | | | 361/62 |
| 2009/0211280 A1* | 8/2009 | Alston | H01M 10/482 |
| | | | 62/428 |
| 2010/0235046 A1* | 9/2010 | Proefke | F02N 11/0807 |
| | | | 236/91 D |
| 2012/0047928 A1* | 3/2012 | Fukatsu | B60L 53/68 |
| | | | 307/9.1 |
| 2013/0020045 A1* | 1/2013 | Hashigaya | B60H 1/00428 |
| | | | 165/200 |
| 2013/0166119 A1* | 6/2013 | Kummer | H01M 10/625 |
| | | | 701/22 |
| 2015/0183292 A1* | 7/2015 | Muralidhar | F25D 11/003 |
| | | | 62/133 |
| 2016/0362110 A1* | 12/2016 | Martini | B60W 10/06 |
| 2017/0001494 A1 | 1/2017 | Liu et al. | |
| 2017/0057323 A1 | 3/2017 | Neu et al. | |
| 2018/0001739 A1 | 1/2018 | Vehr et al. | |
| 2018/0001744 A1 | 1/2018 | Vehr et al. | |
| 2018/0029436 A1 | 2/2018 | Zaeri et al. | |
| 2018/0245825 A1 | 8/2018 | Koelsch | |
| 2018/0304724 A1 | 10/2018 | Sun et al. | |
| 2018/0304836 A1* | 10/2018 | DeCia | B60H 1/00778 |
| 2018/0334170 A1* | 11/2018 | Liu | B60W 10/30 |
| 2020/0122584 A1* | 4/2020 | Zhang | B60W 10/30 |
| 2020/0130645 A1* | 4/2020 | Srnec | B60R 25/04 |
| 2020/0217289 A1* | 7/2020 | Awadi | B60K 6/48 |
| 2020/0338959 A1* | 10/2020 | Carlson | B60L 1/02 |

* cited by examiner

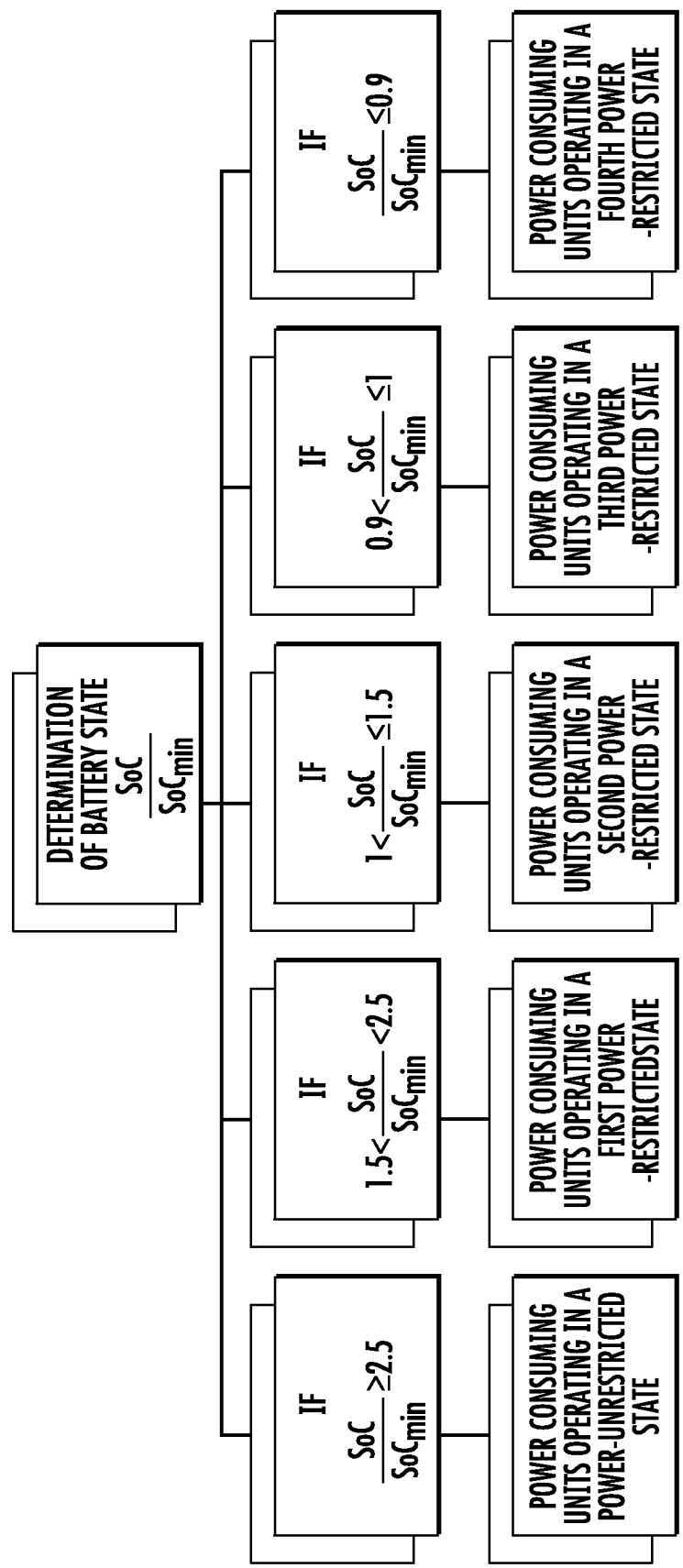

TRANSPORTATION REFRIGERATION SYSTEM, FOR TRANSPORTATION VEHICLE, CONTROL METHOD THEREOF AND ELECTRIC TRANSPORTATION VEHICLE

CROSS REFERENCE TO RELATED APPLICATIONS

This application is a US National Stage of PCT/US2020/034188 filed on May 22, 2020 which claims the benefit of CN Application No.: 201910451000.6, filed on May 28, 2019, which are incorporated herein by reference in their entirety.

FIELD OF THE INVENTION

The present disclosure relates to the field of transport refrigeration, and in particular, to a refrigeration system for an electric transport vehicle and a control method thereof.

BACKGROUND OF THE INVENTION

Transport vehicles for cold chain distribution are typically equipped with a dedicated transport refrigeration system. Such a refrigeration system typically includes a compressor, a condenser, an evaporator, an expansion valve, and other auxiliary components that constitute a refrigeration circuit. The evaporator of the refrigeration system is arranged in a compartment of the transport vehicle for providing a constant-temperature preservation space for the goods to be transported in the vehicle compartment, such as refrigerating preservation or freezing preservation. Such transport vehicles and their refrigeration systems can be powered by diesel, petrol or new energy sources. For example, with the development of new energy sources, some transport vehicles can use power batteries to provide power for transport vehicles and their transport refrigeration systems. During the operation of the vehicle and transport refrigeration system, the power is continuously consumed until its battery charge reaches a minimum set threshold, which means that the vehicle's power battery will have to be charged. If the battery continues to be used until the charges are exhausted, the vehicle will be unable to run or even the battery will be damaged. To avoid such problems, there is currently a type of solution that shuts down the transport refrigeration system when the battery charge reaches a minimum set threshold. In this case, although the travelling duration of the vehicle is prolonged, the insulation temperature in the vehicle compartment will be out of control, which will rise rapidly, affecting the quality of the goods, or even causing deterioration and damage of the goods.

SUMMARY OF THE INVENTION

The present disclosure aims to provide a control method for a transport refrigeration system, which is capable of balancing power distribution of a power battery between power consuming units of a refrigeration system and a transport vehicle. The present disclosure also aims to provide a transport refrigeration system having: components and hardware modules capable of performing the aforementioned control method; and an electric transport vehicle having the transport refrigeration system.

In order to achieve at least one object of the present disclosure, a control method for a transport refrigeration system is provided according to an aspect of the present disclosure, which includes: if a ratio of a current battery charge amount to a minimum battery charge amount is not less than a first preset value, controlling power consuming units in the transport refrigeration system to operate in a power-unrestricted state; and if the ratio of the current battery charge amount to the minimum battery charge amount is less than the first preset value, controlling the power consuming units in the transport refrigeration system to operate in a power-restricted state; wherein the power-restricted state is associated with the ratio of the current battery charge amount to the minimum battery charge amount.

Optionally, when the ratio of the current battery charge amount to the minimum battery charge amount is less than the first preset value, if the ratio of the current battery charge amount to the minimum battery charge amount is greater than a second preset value, the power consuming units in the transport refrigeration system are controlled to operate in a first power-restricted state; at this point, the power supply amounts to and the maximum operating speeds of a compressor and a condenser fan of the power consuming units are limited, and a cooling capacity generated by the transport refrigeration system is capable of maintaining the compartment of the electric transport vehicle at a set temperature.

Optionally, when the ratio of the current battery charge amount to the minimum battery charge amount is not greater than the second preset value, if the ratio of the current battery charge amount to the minimum battery charge amount is greater than a third preset value, the power consuming units in the transport refrigeration system are controlled to operate in a second power-restricted state; at this point, the power supply amounts to the compressor and the condenser fan of the power consuming units are limited to minimum power supply amounts, the operating speeds of the compressor and the condenser fan are limited to minimum operating speeds, and the minimum power supply amounts enable the cooling capacity generated by the transport refrigeration system to be capable of maintaining the compartment of the electric transport vehicle close to the set temperature.

Optionally, when the ratio of the current battery charge amount to the minimum battery charge amount is not greater than the third preset value, if the ratio of the current battery charge amount to the minimum battery charge amount is greater than a fourth preset value, the power consuming units in the transport refrigeration system are controlled to operate in a third power-restricted state; at this point, the power supply amounts to the compressor and the condenser fan of the power consuming units are limited to 0, but a power supply amount to an evaporator fan maintains normal to drive air in the compartment of the electric transport vehicle to flow.

Optionally, when the ratio of the current battery charge amount to the minimum battery charge amount is not greater than the fourth preset value, the power consuming units in the transport refrigeration system are controlled to operate in a fourth power-restricted state; at this point, the power supply amounts to the compressor, the condenser fan and the evaporator fan of the power consuming units are limited to 0.

Optionally, when the power consuming units in the transport refrigeration system operate in the fourth power-restricted state, a power supply amount to a temperature display screen of the power consuming units maintains normal to display a current temperature in the compartment of the transport vehicle.

Optionally, the first preset value is 2.5; and/or the second preset value is 1.5; and/or the third preset value is 1; and/or the fourth preset value is 0.9.

Optionally, the power consuming units in the transport refrigeration system are powered by a power battery of the electric transport vehicle.

To achieve at least one object of the present disclosure, a transport refrigeration system is provided according to another aspect of the present disclosure, which is configured to adjust an internal temperature of a vehicle compartment of an electric transport vehicle, wherein the refrigeration system includes an evaporator and an evaporator fan that are disposed inside the vehicle compartment, a condenser, a condenser fan and a compressor that are disposed outside the vehicle compartment; and a control module configured to control a battery of the electric transport vehicle to supply power to the evaporator fan, the condenser fan, and the compressor; wherein, if a ratio of a current battery charge amount to a minimum battery charge amount is not less than a first preset value, the control module controls power consuming units in the transport refrigeration system to operate in a power-unrestricted state; and if the ratio of the current battery charge amount to the minimum battery charge amount is less than the first preset value, the control module controls the power consuming units in the transport refrigeration system to operate in a power-restricted state; and wherein the power-restricted state is associated with the ratio of the current battery charge amount to the minimum battery charge amount.

In order to achieve at least one object of the present disclosure, an electric transport vehicle is further provided according to still another aspect of the present disclosure, which includes: the transport refrigeration system as described above; and a power battery; wherein the power battery supplies power for the vehicle and power consuming units in the transport refrigeration system simultaneously.

According to the control method for the transport refrigeration system of the present disclosure, a power supplying state of the power battery is determined by analyzing the ratio of the current battery charge amount to the minimum battery charge amount, so that the power consuming units in the transport refrigeration system can be controlled to operate in a power-unrestricted state or a power-restricted state, and the degree of the power-restricted state is associated with the ratio of the battery charge amount to the minimum battery charge amount, thereby ensuring that power consumption of the transport refrigeration system is gradually reduced as the remaining power of the power battery is reduced. On one hand, the influence of a sudden change of temperature on the goods in the vehicle compartment is avoided, and on the other hand, the travelling duration of the vehicle is prolonged as much as possible, thus achieving a better balance between preservation of goods and vehicle operation.

BRIEF DESCRIPTION OF THE DRAWINGS

FIG. 1 is a schematic diagram of a control flow of an embodiment of a control method for a transport refrigeration system of the present disclosure.

DETAILED DESCRIPTION OF THE EMBODIMENT(S) OF THE INVENTION

The present disclosure herein provides an embodiment of a control method for a transport refrigeration system. The transport refrigeration system may have conventional components in existing transport refrigeration systems, including a compressor, a condenser, a throttling element, and an evaporator that are connected in sequence to form a refrigeration circuit. The condenser and the evaporator respectively have a condenser fan and an evaporator fan that are configured to drive air to flow through the surfaces of the condenser and evaporator for heat exchange. For the transport refrigeration system, it has at least the compressor, the condenser fan and the evaporator fan as power consuming units, the power consumption of which cannot be ignored. Therefore, if it is necessary to limit the power output of the power battery to the transport refrigeration system in some application situations and the power should be supplied to the transport vehicle as much as possible, then the power supply to part of at least the above power consuming units in the transport refrigeration system should be restricted as needed.

As a way of coordinating power supply distribution of a power battery between the transport vehicle and the refrigeration system, the control method focuses on how to limit the power supply to the transport refrigeration system to extend the travelling duration of the transport vehicle, in a case that the power battery is in a low charge state, while causing no sudden change in the insulation temperature in the compartment and deterioration and damage of the goods caused thereby, etc.

Specifically, referring to FIG. 1, as an embodiment of the control method, the method includes the following step: if a ratio of a current battery charge amount to a minimum battery charge amount is not less than a first preset value, for example, not less than 2.5, it indicates that the current battery power reserve is far higher than a warning value set by the battery manufacturer or the user. In this situation, there is no need to worry about the vehicle's mileage problem, so there is no need to impose any restriction on the power consuming units in the transport refrigeration system. They can operate in a power-unrestricted state so that the power consuming units in the system can be supplied power according to actual needs. For example, to ensure that the temperature inside the vehicle compartment is quickly adjusted to a set temperature, the power supply to the power consuming units in the system can be increased to a rated maximum value so that the compressor can operate at full capacity for providing cooling, and the volume of air flowing through the condenser and the evaporator is kept at the maximum to provide high heat exchange efficiency; for example, after the compartment temperature is adjusted to a set temperature, the power supply to the power consuming units in the system can be reduced correspondingly, so long as the compressor, the condenser fan and the evaporator fan or other power consuming units can be maintained in an appropriate operating state and it can be ensured that the temperature inside the vehicle compartment is stably maintained near the set temperature.

In addition, if the ratio of the current battery charge amount to the minimum battery charge amount is less than the first preset value, for example, less than 2.5, it indicates that the current battery power reserve is close to a warning value set by the battery manufacturer or the user, and now more power may be supplied to the transport vehicle, while the power consuming units in the transport refrigeration system are controlled to operate in a power-restricted state, and the power-restricted state is associated with the ratio of the battery charge amount to the minimum battery charge amount. That is, the degree or proportion of power supply to the transport refrigeration system should be gradually reduced according to the remaining charge amount that is continuously decreasing.

This control method determines the power supply state of the power battery by analyzing the ratio of the current battery charge to the minimum battery charge, and then starts to coordinate the power supply distribution of the power battery to the vehicle and the refrigeration system before the charge of the power battery reaches a warning line. The power consuming units in the transport refrigeration system are controlled as needed to operate in a power-unrestricted state or a power-restricted state, and the degree of the power-restricted state of the power-consuming units is associated with the ratio of the battery charge amount to the minimum battery charge amount. This provides a more stable adjustment manner to ensure that the power consumption of the transport refrigeration system is gradually reduced as the remaining charge of the power battery is decreasing. On one hand, the influence of a sudden change of temperature on the goods in the vehicle compartment is avoided, and on the other hand, the travelling duration of the vehicle is prolonged as much as possible, thus achieving a better balance between preservation of goods and vehicle operation.

It is mentioned in the above embodiment that the power-restricted state of the power consuming units can be associated with the ratio of the battery charge amount to the minimum battery charge amount. Several examples are additionally provided herein in combination with FIG. 1 to describe how to adjust the degree of power-restricted state of the power consuming units based on the ratio of battery charge amount to the minimum battery charge amount.

For example, when the ratio of the current battery charge amount to the minimum battery charge amount is less than the first preset value, for example, less than 2.5, if the ratio of the current battery charge amount to the minimum battery charge amount is further greater than a second preset value, for example, greater than 1.5, then it indicates that the current battery power reserve is initially close to the warning value set by the battery manufacturer or the user, and now more power may be gradually supplied to the transport vehicle, so the power consuming units in the transport refrigeration system may be controlled to operate in a first power-restricted state. At this point, the power supply amount to the compressor and the condenser fan of the power consuming units will be limited to a value lower than a rated maximum power supply amount, so that the maximum operating speeds of them are limited, but at this power supply amount and the corresponding operating speeds, the cooling capacity generated by the transport refrigeration system can still maintain the compartment of the electric transport vehicle at a required temperature.

For example, as the vehicle continues to run and the refrigeration system continues to operate, when the ratio of the current battery charge amount to the minimum battery charge amount is not greater than the second preset value, for example, not greater than 1.5, if the ratio of the current battery charge amount to the minimum battery charge amount is greater than a third preset value, for example, greater than 1, then it indicates that the current battery power reserve is extremely close to or even reaches the warning value set by the battery manufacturer or the user, and a greater more power should be supplied to the transport vehicle, so the power consuming units in the transport refrigeration system may be controlled to operate in a second power-restricted state. At this point, the power supply amount to the compressor and the condenser fan of the power consuming units is be limited to a minimum power supply amount, the operating speeds of the compressor and the condenser fan are limited to minimum operating speeds, and the cooling capacity generated by the transport refrigeration system can maintain the compartment of the electric transport vehicle close to a set temperature.

For another example, as the vehicle continues to run and the refrigeration system continues to operate, when the ratio of the current battery charge amount to the minimum battery charge amount is not greater than the third preset value, for example, not greater than 1, if the ratio of the current battery charge amount to the minimum battery charge amount is greater than a fourth preset value, for example, greater than 0.9, then it indicates that the current battery power reserve begins to fall below the warning value set by the battery manufacturer or the user, and the remaining power reserve is extremely limited; at this point, consideration should be given to shut down some of the power consuming units of the transport refrigeration system in order to maintain the running of the vehicle as much as possible, so the power consuming units in the transport refrigeration system may be controlled to operate in a third power-restricted state. At this point, the power supply amount to the compressor and the condenser fan of the power consuming units is be limited to 0, but a power supply amount to the evaporator fan maintains normal to drive air in the compartment of the electric transport vehicle to flow.

For still another example, when the ratio of the current battery charge amount to the minimum battery charge amount is not greater than the fourth preset value, for example, not greater than 0.9, then it indicates that the current battery power reserve is low enough to require immediate charging, otherwise the vehicle may stop running or the battery may even be damaged. At this point, consideration should be given to shut down the mainly-power-consuming unit of the transport refrigeration system to maintain the running of the vehicle as much as possible so that the vehicle can reach the charging station, so the power consuming units in the transport refrigeration system may be controlled to operate in a fourth power-restricted state. At this point, the power supply amount to the compressor, the condenser fan and the evaporator fan of the power consuming units is be limited to 0. In view of the fact that in some cases, some goods may still be preserved in the compartment, in order to know in real time the preservation condition of the goods in the compartment, when the power consuming units in the transport refrigeration system are operating in the fourth power-restricted state, a power supply amount to a temperature display screen of the power consuming units which consumes very little power can maintains normal to display the current temperature of the compartment of the electric transport vehicle.

While specific values of the preset values of determination steps in the method are described in the embodiment of the foregoing control method in combination with FIG. 1, it should be understood that the foregoing values are set for illustrative purposes. In light of the teachings of the present disclosure, those skilled in the art can adjust the aforementioned preset values without creative efforts to meet the actual requirements of different transport refrigeration systems, different transport vehicles, and power batteries of different specifications.

Moreover, although not shown in the drawings, an embodiment of a transport refrigeration system is also provided herein by the present disclosure, which is configured to adjust an internal temperature of a vehicle compartment of an electric transport vehicle. Generally, it includes at least an evaporator and an evaporator fan that are disposed inside the vehicle compartment, a condenser, a condenser fan and a compressor that are disposed outside the vehicle compartment; and a control module configured to control a battery of the electric transport vehicle to supply power to the evaporator fan, the condenser fan, and the compressor, wherein the control module can make restricted or unrestricted power supply control over power consuming units in the transport refrigeration system based on the power storage degree of the power battery.

For example, if the ratio of the current battery charge amount to the minimum battery charge amount is not less than the first preset value, it indicates that the current battery power reserve is still far higher than the warning value set by the battery manufacturer or the user. In this situation, there is no need to worry about the vehicle's mileage problem, so there is no need to impose any restriction on the power consuming units in the transport refrigeration system. They can operate in a power-unrestricted state so that the power consuming units in the system can be supplied power according to actual needs. For example, to ensure that the temperature inside the vehicle compartment is quickly adjusted to a set temperature, the power supply to the power consuming units in the system can be increased to a rated maximum value so that the compressor can operate at full capacity for providing cooling, and the volume of air flowing through the condenser and the evaporator is kept at the maximum to provide high heat exchange efficiency; for example, after the compartment temperature is adjusted to a set temperature, the power supply to the power consuming units in the system can be reduced correspondingly, so long as the compressor, the condenser fan and the evaporator fan or other power consuming units can be maintained in an appropriate operating state and it can be ensured that the temperature inside the vehicle compartment is stably maintained near the set temperature.

If the ratio of the current battery charge amount to the minimum battery charge amount is less than the first preset value, for example, less than 2.5, it indicates that the current battery power reserve is close to a warning value set by the battery manufacturer or the user, and now more power may be supplied to the transport vehicle, while the power consuming units in the transport refrigeration system are controlled to operate in a power-restricted state, and the power-restricted state is associated with the ratio of the battery charge amount to the minimum battery charge amount. That is, the degree or proportion of power supply to the transport refrigeration system should be gradually reduced according to the remaining charge amount that is continuously decreasing.

The transport refrigeration system determines the power supply state of the power battery by analyzing the ratio of the current battery charge amount to the minimum battery charge amount, and then starts to coordinate the power supply distribution of the power battery to the vehicle and the refrigeration system before the charge of the power battery reaches a warning line. The power consuming units in the transport refrigeration system are controlled as needed to operate in a power-unrestricted state or a power-restricted state, and the degree of the power-restricted state of the power-consuming units is associated with the ratio of the battery charge amount to the minimum battery charge amount. This provides a more stable adjustment manner to ensure that the power consumption of the transport refrigeration system is gradually reduced as the remaining charge of the power battery is decreasing. On one hand, the influence of a sudden change of temperature on the goods in the vehicle compartment is avoided, and on the other hand, the travelling duration of the vehicle is prolonged as much as possible, thus achieving a better balance between preservation of goods and vehicle operation.

Moreover, although not shown in the drawings, an electric transport vehicle is herein further provided by the present disclosure, which includes the transport refrigeration system of any of the foregoing embodiments or combinations thereof, and a power battery. The power battery supplies power for the vehicle and power consuming units in the transport refrigeration system simultaneously. The electric transport vehicle of this arrangement can also start to coordinate the power supply distribution of the power battery to the vehicle and the refrigeration system before the charge of the power battery reaches a warning line, ensuring that the power consumption of the transport refrigeration system is gradually reduced as the remaining charge of the power battery is decreasing. On one hand, the influence of a sudden change of temperature on the goods in the vehicle compartment is avoided, and on the other hand, the travelling duration of the vehicle is prolonged as much as possible, thus achieving a better balance between preservation of goods and vehicle operation. No repeated detailed description is given herein.

The power supply coordination of the electric transport vehicle to which the control method for the transport refrigeration system in the foregoing embodiment is applied in a delivery process will be described with reference to FIG. 1 as follows.

First of all, when scheduling the delivery by an electric transport vehicle, such as an electric refrigeration vehicle, a longer mileage of it and more goods to be delivered should be expected as much as possible. Before the refrigeration vehicle starts to deliver, the power battery is in a full-charge state. At this point, the vehicle compartment is pre-cooled to a set temperature within the shortest duration, and a cooler is required to provide a maximum cooling capacity, so a maximum operable rotating speed of a variable frequency compressor is not limited (for example, 6000 RPM), and at the same time, a maximum operable rotating speed of a variable frequency condenser fan is also not limited (for example, 3000 RPM) to ensure a normal operation of the refrigeration system, thereby rapidly cooling the vehicle compartment to the set temperature.

Subsequently, goods are loaded and delivered, and the cooler now is in an operational state. After the refrigeration vehicle has delivered the goods for a period of time, the charge of the power battery is reduced, and the amount of goods in the compartment is reduced. At this point, the goods are maintained at the set temperature, and the maximum cooling capacity is not required, so that power supply of the power battery to the power consuming units in the transport refrigeration system can be reduced. At this point, the maximum operable rotating speed of the compressor will be limited to an intermediate speed (for example, 4200 RPM), and the maximum operable rotating speed of the variable frequency condenser fan will also be reduced accordingly (for example, 2200 RPM).

Thereafter, as the refrigeration vehicle continues to deliver goods, the charge of the power battery continues to drop and the goods are further reduced, which will also result in a further reduction in the cooling capacity required to maintain the temperature of the goods. Therefore, power supply of the power battery to the power consuming units in the transport refrigeration system can be reduced again. At this point, the rotating speed of the variable frequency compressor in operation will be limited to a minimum speed (for example, 1800 RPM), and the rotating speed of the variable frequency condenser fan in operation will also be limited to a minimum speed (for example, 1000 RPM).

Furthermore, as the goods are further reduced and the charge of the power battery is further reduced, in order to ensure that the refrigeration vehicle can continue to run, the compressor of the refrigeration system will be controlled to stop operation, the condenser fan will be controlled to stop operation, and only the operation of the evaporator fan is maintained, thereby driving the air in the vehicle compartment in circulation.

Eventually, when the electric refrigeration vehicle's power drops to a degree where it is remained to charge, the compressor, the condenser fan, and the evaporator fan of the refrigeration system will all be controlled to stop operation. At this point, in order to ensure that the user can also know the insulation condition of the remaining goods in the compartment, power supply to the temperature display screen in the system can be continued, so that it can continue displaying the temperature inside the compartment.

The transport refrigeration system, the control method therefor and the electric transport vehicle according to the present disclosure are mainly described in the above examples. While only some of the embodiments of the present disclosure have been described, those skilled in the art will understand that the present disclosure can be carried out in many other forms without departing from the spirit and scope thereof Therefore, the illustrated examples and embodiments should be considered as illustrative rather than limiting, and the present disclosure can cover various modifications and replacements without departing from the spirit and scope of the present disclosure defined by individual appended claims.

What is claimed is:

1. A control method for a transport refrigeration system, the control method comprising:
    responsive to a ratio of a current battery charge amount to a minimum battery charge amount is not less than a first preset value, controlling power consuming units in the transport refrigeration system to operate in a power-unrestricted state; and
    responsive to the ratio of the current battery charge amount to the minimum battery charge amount is less than the first preset value, controlling the power consuming units in the transport refrigeration system to operate in a power-restricted state;
    wherein the power-restricted state is associated with the ratio of the current battery charge amount to the minimum battery charge amount.

2. The control method according to claim 1 further comprising:
    making a first determination that the ratio of the current battery charge amount to the minimum battery charge amount is less than the first preset value;
    making a second determination that the ratio of the current battery charge amount to the minimum battery charge amount is greater than a second preset value; and
    based on the first determination and the second determination, controlling the power consuming units in the transport refrigeration system to operate in a first type of the power-restricted state such that:
        a cooling capacity generated by the transport refrigeration system is operable to maintain the compartment of the electric transport vehicle at a set temperature; and
        maximum operating speeds of a compressor and a condenser fan of the power consuming units are limited.

3. The control method according to claim 2, wherein when the ratio of the current battery charge amount to the minimum battery charge amount is not greater than the second preset value, if the ratio of the current battery charge amount to the minimum battery charge amount is greater than a third preset value, the power consuming units in the transport refrigeration system are controlled to operate in a second type of the power-restricted state; at this point, the power supply amounts to the compressor and the condenser fan of the power consuming units are limited to minimum power supply amounts, the operating speeds of the compressor and the condenser fan are limited to minimum operating speeds, and the cooling capacity generated by the transport refrigeration system is capable of maintaining the compartment of the electric transport vehicle close to the set temperature.

4. The control method according to claim 3, wherein when the ratio of the current battery charge amount to the minimum battery charge amount is not greater than the third preset value, if the ratio of the current battery charge amount to the minimum battery charge amount is greater than a fourth preset value, the power consuming units in the transport refrigeration system are controlled to operate in a third type of the power-restricted state; at this point, the power supply amounts to the compressor and the condenser fan of the power consuming units are limited to 0, but a power supply amount to an evaporator fan maintains normal to drive air in the compartment of the electric transport vehicle to flow.

5. The control method according to claim 4, wherein when the ratio of the current battery charge amount to the minimum battery charge amount is not greater than the fourth preset value, the power consuming units in the transport refrigeration system are controlled to operate in a fourth power-restricted state; at this point, the power supply amounts to the compressor, the condenser fan and the evaporator fan of the power consuming units are limited to 0.

6. The control method according to claim 5, wherein when the power consuming units in the transport refrigeration system operate in the fourth power-restricted state, a power supply amount to a temperature display screen of the power consuming units maintains normal to display a current temperature in the compartment of the transport vehicle.

7. The control method according to claim 5, wherein the first preset value is 2.5; and/or the second preset value is 1.5; and/or the third preset value is 1; and/or the fourth preset value is 0.9.

8. The control method according to any one of claims 1 to 7, wherein the power consuming units in the transport refrigeration system are powered by a power battery of the transport vehicle.

9. A transport refrigeration system, which is configured to adjust an internal temperature of a vehicle compartment of an electric transport vehicle, wherein the refrigeration system comprises an evaporator and an evaporator fan that are disposed inside the vehicle compartment, a condenser, a condenser fan, a compressor and a throttling element that are disposed outside the vehicle compartment, the compressor, the condenser, the throttling element and the evaporator being connected in sequence to form a refrigeration circuit; and a control module configured to control a battery of the electric transport vehicle to supply power to the evaporator fan, the condenser fan, and the compressor; wherein the control module controls the refrigeration system according to the control method according to any one of claims 1 to 8.

10. An electric transport vehicle, comprising: the transport refrigeration system according to claim 9; and a power battery; wherein the power battery supplies power for the vehicle and power consuming units in the transport refrigeration system simultaneously.

\* \* \* \* \*